(12) United States Patent
Schoedel et al.

(10) Patent No.: US 11,371,275 B2
(45) Date of Patent: Jun. 28, 2022

(54) METHOD FOR CONTROLLING A DRIVE ARRANGEMENT FOR A FLAP OF A MOTOR VEHICLE

(71) Applicant: Brose Fahrzeugteile GmbH & Co. Kommanditgesellschaft, Bamberg, Bamberg (DE)

(72) Inventors: Sebastian Schoedel, Eckersdorf (DE); Detlef Russ, Ebersdorf (DE)

(73) Assignee: Brose Fahrzeugteile GmbH SE & Co. Kommanditgesellschaft, Bamberg, Bamberg (DE)

( * ) Notice: Subject to any disclaimer, the term of this patent is extended or adjusted under 35 U.S.C. 154(b) by 731 days.

(21) Appl. No.: 16/380,241

(22) Filed: Apr. 10, 2019

(65) Prior Publication Data

US 2019/0309558 A1    Oct. 10, 2019

(30) Foreign Application Priority Data

Apr. 10, 2018   (DE) .................. 10 2018 108 473.0

(51) Int. Cl.
*E05F 15/611* (2015.01)
*H02P 21/13* (2006.01)
(Continued)

(52) U.S. Cl.
CPC ............ *E05F 15/611* (2015.01); *H02P 21/13* (2013.01); *H02P 21/18* (2016.02);
(Continued)

(58) Field of Classification Search
CPC .......... H02P 21/13; H02P 21/18; E05F 15/611
(Continued)

(56) References Cited

U.S. PATENT DOCUMENTS 8,901,871 B2 * 12/2014 Park .................. G05B 19/19
                                                        318/560

FOREIGN PATENT DOCUMENTS

| CN | 106026817 | 10/2016 |
| DE | 102006057014 | 6/2008 |

(Continued)

OTHER PUBLICATIONS

"German Search Report," for German Patent Application No. 102018108473.0 dated Dec. 20, 2018 (5 pages).

*Primary Examiner* — David Luo
(74) *Attorney, Agent, or Firm* — Pauly, DeVries Smith & Deffner LLC

(57) ABSTRACT

The disclosure provides a method for controlling a drive arrangement for a flap of a vehicle by a control arrangement, wherein in a measuring routine a measured movement value is measured by a movement measuring system. It is proposed that in an estimation routine an estimated movement value is estimated, in a movement routine the estimated movement value is determined via the estimation routine and the flap is adjusted according to a set movement value, in a correction routine the estimated movement value is determined from the estimation routine and an estimation error is determined and from the estimated movement value and according to a correction specification the set of model parameters is corrected based on the estimation error and supplied to the estimation routine and in the correction routine the correction of the set of model parameters is performed for a part section of the motorized movement cycle.

20 Claims, 2 Drawing Sheets

(51) Int. Cl.
  *H02P 21/18*   (2016.01)
  *H03H 17/02*   (2006.01)
  *B60J 5/10*    (2006.01)
  *B62D 25/10*   (2006.01)

(52) U.S. Cl.
  CPC ............ *H03H 17/0202* (2013.01); *B60J 5/10* (2013.01); *B62D 25/10* (2013.01); *E05Y 2400/40* (2013.01); *E05Y 2900/531* (2013.01); *E05Y 2900/532* (2013.01); *E05Y 2900/536* (2013.01); *E05Y 2900/546* (2013.01); *E05Y 2900/548* (2013.01); *H03H 2017/0205* (2013.01)

(58) Field of Classification Search
  USPC .............................................. 701/49; 318/34
  See application file for complete search history.

(56) References Cited

FOREIGN PATENT DOCUMENTS

| | | |
|---|---|---|
| DE | 102008057014 | 5/2010 |
| EP | 1768250 | 3/2007 |
| EP | 1879288 | 1/2008 |

\* cited by examiner

METHOD FOR CONTROLLING A DRIVE ARRANGEMENT FOR A FLAP OF A MOTOR VEHICLE

CLAIM OF PRIORITY

This application claims the benefit of German Patent application No. DE 10 2018 108 473.0 filed on Apr. 10, 2018, the disclosure of which is incorporated herein by reference.

FIELD OF THE TECHNOLOGY

The disclosure relates to a method for controlling a drive arrangement for a flap of a motor vehicle, a control arrangement for performing the above mentioned method, a drive arrangement having such a control arrangement and also a flap arrangement having such a drive arrangement.

BACKGROUND

Within the scope of increasing the comfort factor in motor vehicles, the motorized adjustment of flaps has become particularly important. Such a flap is by way of example a tailgate, a trunk lid, a front hood, or the like.

On account of the ever increasing weight of flaps, it is known to provide the drive arrangement under discussion with at least one electric drive that engages or rather that engage by way of example with an edge or rather with opposite-lying edges of the flap.

Two spindle drives that are controlled by means of a control arrangement are provided in the case of the known method for controlling such a drive arrangement (DE 10 2008 057 014 A1) on which the disclosure is based. For this purpose, the spindle drives are each equipped with a sensor system for detecting a measured movement value. The two sensor systems each comprise a Hall sensor. It is possible to control the drive arrangement with a high degree of accuracy on the basis of the two measured movement values. However, this type of control procedure by means of the two sensor systems is comparatively costly.

It is fundamentally also known to determine without a sensor a movement value such as an angle of rotation for a drive. A known method (EP 1 768 250 A2) relates by way of example to an observer estimating a movement value based on a drive model and based on input variables such as motor voltage and motor current. In addition, a correction routine for correcting the estimated movement value and also for correcting the drive model is provided, which uses the effect of the commutating ripples in the case of commutated DC motors. Whereas this renders it fundamentally possible to determine a movement value for a drive without having to provide for this necessary costly sensors, the anticipated accuracy during the procedure of determining the movement value is low. The reason for this resides in the fact that the commutation ripple in the motor current during the motorized adjustment of the relevant components occurs with varying reliability. This means that the anticipated correction result in the case of the latter mentioned known method is accordingly less reliable.

SUMMARY

The object of the disclosure is to propose a method for controlling a drive arrangement for a flap of a motor vehicle, said method to render it is possible to achieve a high degree of reliability with a small cost outlay.

The above mentioned problem is achieved in the case of a method as disclosed herein.

Essentially, the fundamental consideration is that the movement value that is to be determined is not only estimated but rather is also measured in order to be able to correct the estimated value where necessary. The correction is only provided for a part section or rather for part sections of the motorized movement cycle with the result that it is fundamentally possible to perform the correction only if reliable measured values are available. Consequently, it is possible to use for the measurement a relatively less reliable measuring method without disproportionately impairing the correction of the estimated value.

In detail, it is initially proposed that in an estimation routine an estimated movement value for the drive is estimated based on a drive model that may be parameterized by means of a set of model parameters. It is further proposed that in a movement routine the estimated movement value is continuously determined via the estimation routine and in a motorized movement cycle based on the estimated movement value the flap is adjusted according to a set movement value that is available in the control arrangement. Finally, it is proposed that in a correction routine for a movement cycle the estimated movement value is determined from the estimated routine and an estimation error is determined from the measured movement value and from the estimated movement value and corrected according to a correction specification of the set of model parameters based on the estimation error and is supplied to the estimation routine. It is essential in this case that in the correction routine the correction of the set of model parameters is only performed for at least a part section of the motorized movement cycle.

The solution in accordance with the proposal provides at all times an estimated movement value that is the basis for realizing the set movement value. The correction routine may be easily configured in a robust manner in contrast to less reliable measured movement values with the result that overall the drive arrangement is controlled in a reliable manner.

A further advantage of the solution in accordance with the proposal is based on the fact that when the respective estimation methods are configured in an appropriate manner the estimated movement values are only to a small extent low-pass filtered or are not low-pass filtered at all with the result that a change in the actual speed of the drive acts on the estimated movement values with high dynamics. This may be used by way of example when realizing an anti-trap protection function. It can be that a trapping event test routine is provided for this purpose. Such a trapping event test routine is used to detect a predefined trapping event that manifests itself in a mostly sudden reduction in the adjustment speed on at least one side of the flap. In such a trapping event, it is necessary to react rapidly to a change in the flap speed. This is where the above mentioned high dynamics of the estimated movement value are particularly advantageous.

It can be that the correction specification defines a control circuit that ensures the estimation errors are reduced, in particular are minimized. Such a control circuit may be realized using simple control means.

Various embodiments relate to the definition of the movement value as a position value, as a speed value or as an acceleration value. One of these methods may be used depending upon which type of movement control is provided for the drive arrangement.

An interesting aspect in the case of various embodiments is the fact that the movement routine is performed in this case based exclusively on the estimated movement value and not based on the measured movement value. This means that the measured movement value influences the movement routine in any case indirectly, namely via the correction routine. It is thus ensured that the drive arrangement is controlled based on movement values that have a constant progression. This would be different if in the movement routine sometimes the estimated movement value has been used and sometimes the measured movement value has been used for controlling the drive arrangement. The constant progression of the movement values that form the basis for the control procedure leads to the movement routine being configured in a particularly simple manner.

By virtue of the fact that the estimation routine is always based on the respective last corrected drive model, it is possible in accordance with various embodiments to optimize the control procedure in a particularly rapid manner. This means that the corrected drive model is incorporated without delay into the estimation of the estimated movement value and leads there to a correspondingly delay-free optimization of the estimated movement value.

Various embodiments relate to variants for triggering the correction routine. An embodiment relates to a mechanism in the form of a trigger routine in which the procedure of correcting the set of model parameters via the correction routine is triggered according to a trigger criterion. The trigger criterion may be by way of example a reliability characteristic for the measured movement value. This renders it possible in a simple manner to delay the performance of the correction routine in the absence of reliable measured movement values.

In various embodiments, the measured movement values are not reliable in the case of specific measuring methods particularly in the start-up section of a movement cycle with the result that the correction routine is only performed at the end of the start-up section. This affects in particular the measuring method that is further mentioned above and is based on the effect of the commutation ripples.

In accordance with various embodiments, the procedure of measuring the measured movement value for the drive is based on measuring a drive current and/or on measuring a drive voltage by means of the movement measuring system. This may be implemented in a simple manner without the need for a sensor if the drive is an electrical DC motor as is proposed in a variant. In this case, this produces the further above mentioned commutation ripples that may be detected in accordance with various embodiments as cyclic signal pulses in the drive current or rather in the drive voltage.

Various embodiments relate to advantageous implementation methods for the drive models. In the case of an electric motor, the drive model may be derived by the electrical equivalent circuit of the relevant motor type from resistances, inductivities, etc.

Advantageous implementation variants for the estimation routine are disclosed. In some embodiments, the estimation method associated with the estimation routine is configured according to a type of state observer in particular according to a type of Kalman filtering procedure. The general use of a Kalman filtering procedure for estimating speeds based on a drive model and based on measured operating variables such as the drive voltage and the drive current are known from the prior art. Other estimation methods that may be used here are based on the likewise known Lünberger observer or other types of state observing methods. It is fundamentally also possible in this case to use a simple state space display from which it is possible to derive the respective estimation.

According to various embodiments, the control arrangement for performing the method in accordance with the disclosure. Reference may be made to all statements relating to the proposed method in accordance with the proposal.

According to various embodiments, a drive arrangement for a flap of a motor vehicle having at least one drive that in the assembled state is coupled or rather are coupled to the flap in terms of providing a drive, and having a control arrangement in accordance with the disclosure. Reference may also be made in this respect to all statements relating to the method in accordance with the proposal.

According to various embodiments, a flap arrangement of a motor vehicle having a flap and having a drive arrangement that is allocated to the flap and is in accordance with the proposal is disclosed. Reference may also be made in this respect to all statements relating to the method in accordance with the proposal.

Various embodiments provide a method for controlling a drive arrangement for a flap of a motor vehicle by means of a control arrangement, wherein the drive arrangement comprises at least one electric drive that is coupled to the flap in terms of providing a drive, wherein in a measuring routine a measured movement value for the drive is measured by means of a movement measuring system, wherein in an estimation routine an estimated movement value for the drive is estimated based on a drive model that may be parameterized by means of a set of model parameters, wherein in a movement routine the estimated movement value is continuously determined via the estimation routine and the flap is adjusted according to a set movement value that is present in the control arrangement in a motorized movement cycle based on the estimated movement value, wherein in a correction routine for a movement cycle the estimated movement value is determined from the estimation routine and an estimation error is determined from the measured movement value and from the estimated movement value and according to a correction specification the set of model parameters is corrected based on the estimation error and supplied to the estimation routine and wherein in the correction routine the correction of the set of model parameters is only performed for at least a part section of the motorized movement cycle.

In some embodiments, the movement value is a position value for the drive and/or for the flap, or the movement value is a speed value or an acceleration value for the drive and/or for the flap.

In some embodiments, the measured movement value as such is not taken into consideration in the movement routine during the adjustment of the flap.

In some embodiments, in the estimation routine the estimated movement value for the drive is continuously based on the last corrected drive model.

In some embodiments, a trigger routine is provided and in the trigger routine the procedure of correcting the set of model parameters via the correction routine is triggered according to a trigger criterion, such as a trigger criterion is the presence of a measured movement value having a predetermined reliability characteristic, further the reliability characteristic can be the measured movement value being below a limit variance.

In some embodiments, the movement cylinder starts with a start-up section and the particular part section of the motorized movement cycle that is allocated to the correction routine lies outside the start-up section, the estimated movement value is estimated in the start-up section of a movement cycle based on the drive model that is corrected in a preceding movement cycle, or the estimated movement value is estimated in the start-up section of a movement cycle based on a predefined drive model.

In some embodiments, the measurement of the measured movement value for the drive is based on the measurement of a drive current and/or on a drive voltage by means of the movement measuring system.

In some embodiments, the drive comprises an electric drive motor, such as an electric DC motor, by means of which the respective movement cycle of the flap is generated.

In some embodiments, the drive current and/or the drive voltage having the drive movement of the drive comprises cyclic signal pulses in the drive current and/or in the drive voltage, and the signal pulse is measured by means of the movement measuring system and is determined from the measured signal pulses of the measured movement value.

In some embodiments, the drive model represents a correlation between a set of operating variables of the drive and the estimated movement value and the estimated movement value is determined based on the set of operating variables and the drive model.

In some embodiments, the drive comprises an electric drive motor, and the drive model provides a correlation between the set of operating variables, which are allocated to the drive motor, and the estimated movement value, and, in some embodiments, the set of operating variables includes as respective operating variables the electrical motor current and/or the electrical motor voltage, and/or the set of model parameters includes as respective model parameters an electrical winding inductivity of a drive winding in the drive model and/or an electrical winding resistance of a drive winding in the drive model.

In some embodiments, the estimated movement value is estimated according to an estimation method from a measured set of operating variables by taking into consideration the drive model. In some embodiments, the estimation methods are configured according to a type of state observer in particular according to a type of Kalman filtering procedure.

Various embodiments provide a control arrangement for performing a method as described herein.

Various embodiments provide a drive arrangement for a flap of a motor vehicle having at least one drive that in the assembled state is coupled to the flap in terms of providing a drive and having a control arrangement as described herein.

Various embodiments provide a flap arrangement of a motor vehicle having a flap and a drive arrangement that is allocated to the flap and is in accordance with the disclosure.

BRIEF DESCRIPTION OF THE DRAWINGS

The disclosure is further explained below with the aid of a drawing that represents only one exemplary embodiment. In the drawing.

DETAILED DESCRIPTION

Figure 1:
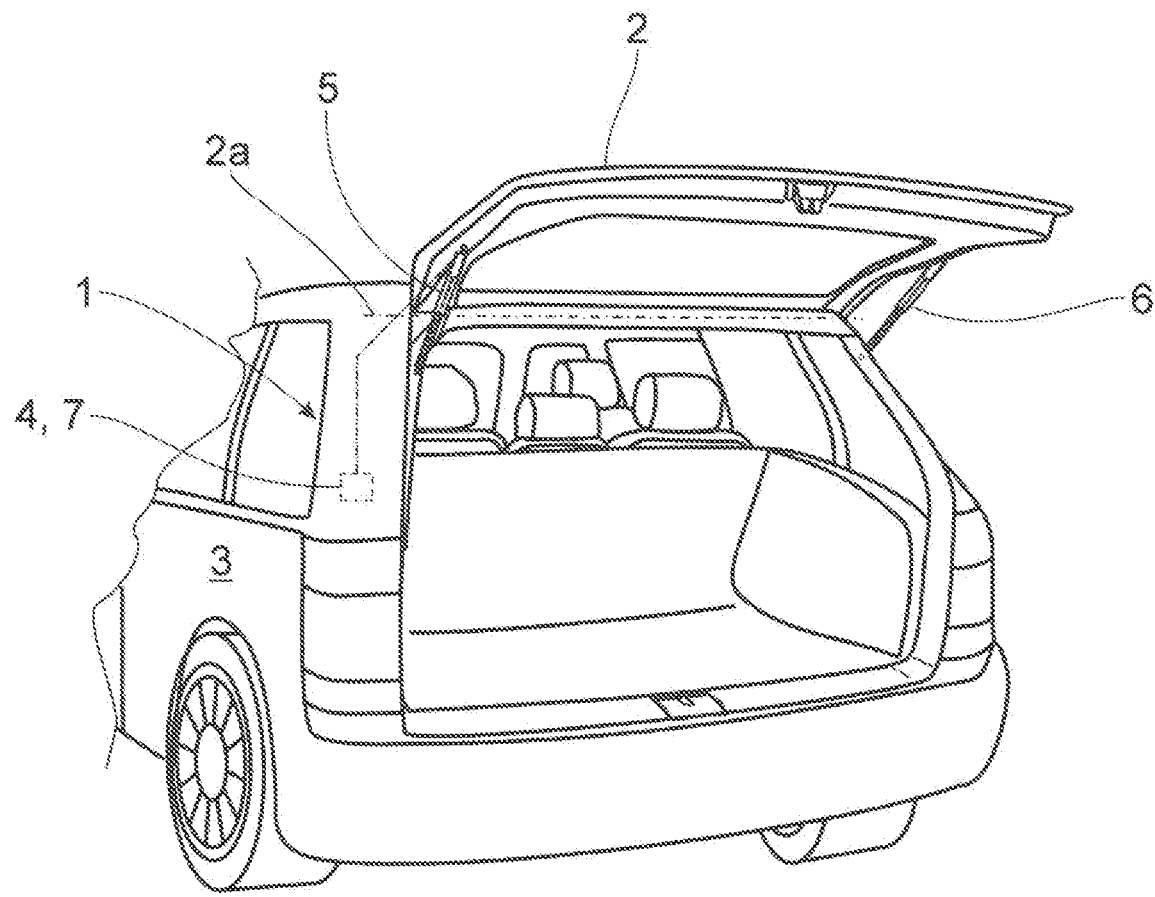
FIG. 1 illustrates the rear region of a motor vehicle having a flap arrangement for performing a method in accordance with the proposal and FIG. 2 illustrates the part that is relevant for the doctrine in accordance with the proposal and is part of the control arrangement of the flap arrangement in accordance with FIG. 1.

The method in accordance with the proposal is used to control a drive arrangement 1 for a flap 2 of a motor vehicle 3 by means of a control arrangement 4.

The term "flap" includes in this case a tailgate, a trunk lid, a front lid, in particular an engine cover, a motor vehicle door in particular a side door or a rear door or the like.

In the case of the illustrated exemplary embodiment, the flap 2 is configured so as to be able to pivot about a flap axis 2a. It can be that the flap axis 2a is oriented essentially in a horizontal direction with the result that the force of the weight of the flap 2 acts at least over an adjustment range of the flap 2 in its closing direction.

The control arrangement 4 may be configured as a flap control device that is allocated to the flap 2 and interacts with a higher ranking motor vehicle control procedure. In lieu of this central approach, it is also possible for the control arrangement 4 to be a component of a central motor vehicle control procedure.

The drive arrangement 1 comprises at least one electrical drive 5 or 6 in this case two drives 5, 6. The drives are in each case coupled to the flap 2 in terms of providing a drive. An exemplary arrangement of such drives 5, 6 is disclosed in DE 10 2006 057 014 A1 that originates from the applicant and the contents of which are herewith made subject matter of the present application.

Figure 2:
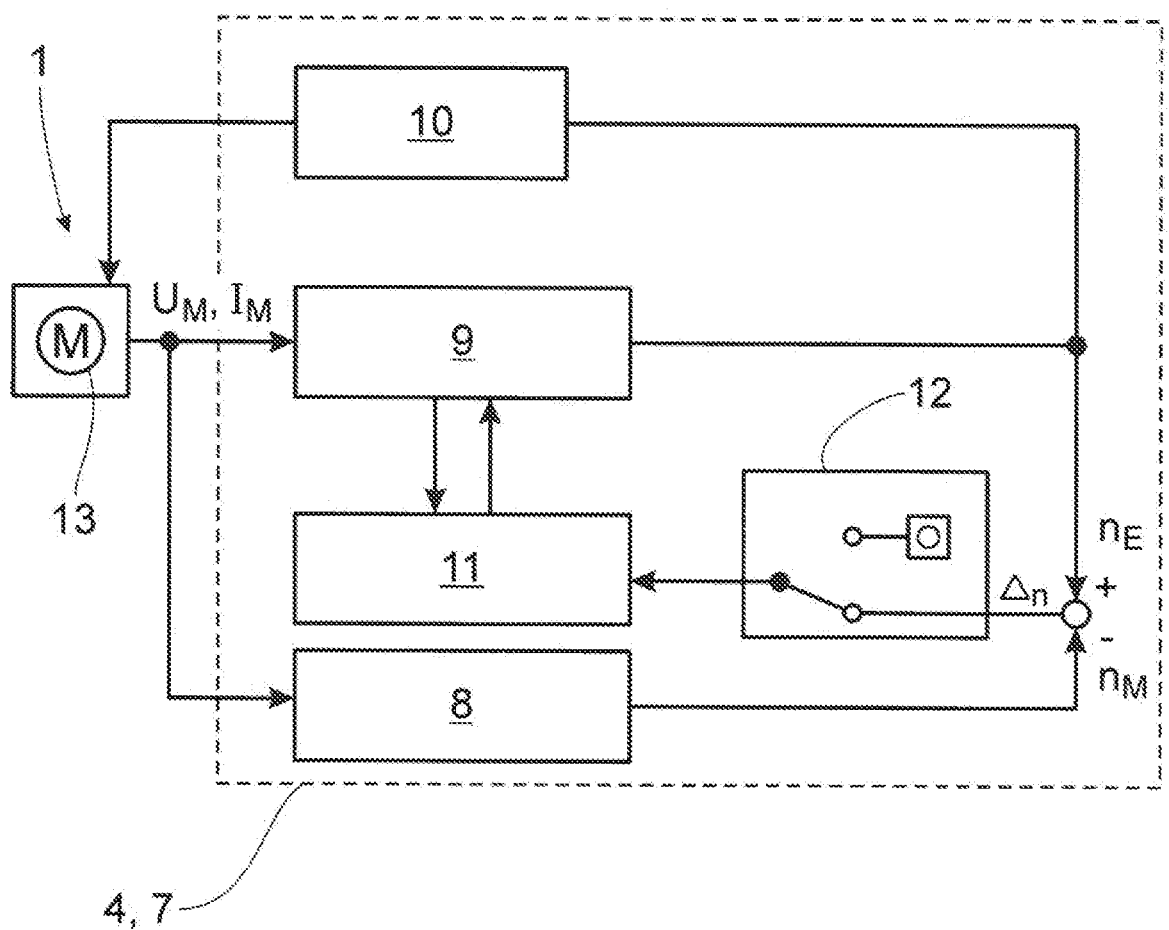

The two drives 5, 6 may follow different drive principles, however, it can be that, as illustrated in FIG. 2, the two drives 5, 6 are each a spindle drive.

In terms of a clear representation, only one single drive 5 is discussed below. In a first variant, an identical control arrangement 4 is allocated to the other drive 6. However, it is fundamentally also possible to provide that the control procedure that is still to be explained is simply assumed for the other driver 6.

A movement measuring system 7 is allocated to the drive 5 and in a measuring routine 8 a measured movement value $n_M$ for the drive 5 is measured by means of said movement measuring system. The movement values that are under discussion here can be a rotational speed of the drive 5. Other variants that are still to be explained are also conceivable.

As mentioned further above, it is not sufficient to measure the measured movement value for the drive arrangement if the manner in which the measured movement value is acquired is relatively less reliable. Accordingly, it is proposed in accordance with the proposal that in an estimation routine 9 an estimated movement value $n_E$ is estimated for the drive 5 based on a drive model that may be parameterized by means of a set of model parameters.

The estimated movement value $n_E$ is based on the procedure of controlling the movement of the flap 2. For this purpose, in the movement routine 10 the estimated movement value $n_E$ is continuously determined via the estimate routine 9 and in a motorized movement cycle the flap 2 is adjusted according to a set movement value that is present in the control arrangement 4 based on the estimated movement value $n_E$. The movement cycle relates to a movement of the flap 2. In this case, an opening movement cycle is provided that relates to an adjustment of the flap 2 from its closed position into an open position. Further, a closing movement cycle may be provided that relates to an adjustment of the flap 2 from an open position into the closed position. A set movement value that includes the flap positions that are to be adopted, a movement profile that is to be maintained or the like is allocated to the respective movement cycle. The set movement value is available in the control arrangement 4 which means that the set movement value is stored or may be stored in the control arrangement 4. The set movement value may be modified by way of example to suit the requirements of the user.

As mentioned above, the estimated movement value is estimated based on a drive model. The drive model is a state model at least of a part of the drive 5 on the basis of which the estimated movement value $n_E$ is performed. The drive model may be parameterized by means of a set of model parameters. The set of model parameters includes at least one model parameter the value of which may be adjusted so as to parameterize the drive model.

An above mentioned estimation of the estimated movement value $n_E$ is fundamentally susceptible to errors that mainly result from errors in an image of the drive 5 that is provided by means of the drive model. In order to reduce the influence of such errors, a correction routine is provided in accordance with the proposal.

In the correction routine 11, the estimated movement value $n_E$ is determined for the relevant movement cycle of the flap 2 from the estimation routine 9. An estimation error is subsequently determined from the measured movement value $n_M$ and the estimated movement value $n_E$. According to a correction specification, the set of model parameters and thus the drive model is ultimately corrected based on the estimated error $\Delta_n$ and supplied to the estimation route 9.

It is now essential for the doctrine in accordance with the proposal that the correction of the set of model parameters is performed in the correction routine only for at least a part section of the motorized movement cycle. This means that in the correction routine the correction of the set of model parameters is not performed continuously but rather is performed for at least one predetermined part section of the motorized movement cycle. This may mean that the correction routine is only performed if reliable measured values for the measured movement value $n_M$ are available. This will be explained in detail further below.

As indicated further above, the term "movement value" in this case stands quite generally for any variable that represents a movement of the drive 5 and thus of the flap 2. Fundamentally, the movement value may be a position value for the drive 5 and/or for the flap 2. Alternatively, the movement value may also be a speed value or acceleration value for the drive 5 and/or for the flap 2.

In this case, the measured movement value $n_M$ as such is not taken into consideration in the movement routine 10 during the adjustment of the flap 2. This means that the measured movement value $n_M$ is not directly involved in the movement control for the flap 2 but rather is indirectly involved via the correction routine.

It can be that the set of model parameters is modified according to the correction specification in such a manner that the estimation error $\Delta_n$ is reduced, in particular minimized. In the simplest case, in the correction routine 11 the set of model parameters is modified step-by-step in dependence upon the estimation error $\Delta_n$ with the result that the modified set of model parameters is produced in each case.

It can be that in the estimation routine 9 the estimated movement value $n_E$ for the drive 5 is continuously estimated based on the last corrected drive model. However, it is also fundamentally possible to provide that a corrected drive model is only incorporated into the estimation if the corrected drive model has been checked for plausibility. A corresponding plausibility routine is provided for this purpose in the control arrangement.

It is of particular importance for the solution in accordance with the proposal to select an appropriate point in time for performing the correction routine. A trigger routine 12 can be provided for this purpose, wherein in the trigger routine 12 the procedure of correcting the set of model parameters via the correction routine 11 is triggered according to a trigger criterion. In the simplest case, the trigger criterion is at least one predetermined part section of the movement cycle of the flap 2. Alternatively or in addition thereto, it is possible to provide that a trigger criterion is the presence of a measured movement value $n_M$ that has a predetermined reliability characteristic. The reliability characteristic is a measure that indicates the extent of the probability that the measured movement value $n_M$ represents the actual movement characteristic of the drive 5. By way of example, it is possible to provide that the reliability characteristic is the fact that the measured movement value $n_M$ is below a limit variance in the stochastic sense.

It is likewise possible to provide a fixed set value of the point in time for performing the correction routine 11 as mentioned above. In this case, it is assumed by way of example that the relevant movement cycle of the flap 2 starts with a start-up section and that the particular part section of the motorized movement cycle that is allocated to the correction routine 11 lies outside the start-up section. Consequently, consideration is given to the fact that in the start-up section the reliability of the measured movement value may be less.

The start-up section can exceed less than 0.1% of the relevant movement cycle of the flap 2. Fundamentally, the duration of the start-up section may also be defined on the basis of rotations of a drive component of the drive 5. By way of example, the start-up section then, in some embodiments, extends over fewer than 10 rotations of a drive component, in particular of a motor shaft, of the drive 5. Other definitions for the start-up section are also conceivable.

It can be that the estimated movement value $n_E$ is estimated in the start-up section of a movement cycle based on the drive model that is corrected in a preceding movement cycle. This may fundamentally be the drive model last corrected prior to the respective start-up section. Alternatively, it may be provided that the estimated movement value $n_E$ is estimated in the start-up section of a movement cycle based on a predefined drive model that by way of example is stored in the control arrangement 4. The two later mentioned alternatives ensure that a drive model for estimating the estimated movement value $n_E$ is provided in the start-up section.

The measurement of the measured movement value $n_M$ for the drive 5 may be fundamentally based on any sensor values, by way of example on the sensor values of a Hall sensor that is allocated to a drive component of the drive 5. In this case, it is however provided that the measurement of the measured movement value $n_M$ for the drive 5 is based on the measurement of a drive current $I_M$ and/or on a drive voltage $U_M$ by means of the movement measuring system. The drive current $I_M$ and the drive voltage $U_M$ can be the current or rather the voltage of a drive motor.

Accordingly, it is provided in this case that the drive 5 comprises an electric drive motor 13 which can be an electric DC motor. The drive motor 13 generates the respective movement cycle of the flap 2.

The drive 5 can be now configured in such a manner that the drive current $I_M$ and/or the drive voltage $U_M$ comprises or rather comprise with the drive movement of the drive 5 cyclic signal pulses in the drive current $I_M$ or rather in the drive voltage $U_M$. These signal pulses can then be measured by means of the movement measurement system, wherein the measured movement value is determined from the measured signal pulses.

Quite generally, the drive model represents a correlation between a set of measured operating variables of the drive 5 and the estimated movement value $n_E$. Wherein the estimated movement value $n_E$ is determined based on the set of operating variables and the drive model.

In the case of the illustrated exemplary embodiment, the drive 5, as mentioned above, is provided with an electrical drive motor 13 that depending upon each application case may be configured as a DC motor with a commutator, as a brushless DC motor, as a universal motor or the like.

The drive model represents a correlation between the set of operating variables that is allocated to the drive motor 13 and the estimated movement value $n_E$ that is to be estimated.

An above mentioned set of operating variables includes as respective operating variables in this case the electrical motor current $I_M$ and/or the electrical motor voltage $U_M$. The control arrangement 4 provides for the measurement of the electrical motor current $I_M$ or rather of the electrical motor voltage $U_M$ measuring arrangements that are not illustrated here.

For the case that the drive model uses an equivalent circuit of the electric drive motor 13 comprising resistances, inductivities, etc., it can be provided that the set of model parameters includes as respective model parameters an electrical winding inductivity of a drive winding in the drive model that represents the drive motor 13 and/or an electrical winding resistance of such a drive winding. Other possibilities for the definition of the model parameters are conceivable.

In the estimation routine 9, the estimation of the estimated movement value $n_E$ is performed according to an estimation method. In this case, the estimation method that is allocated to the estimation routine 9 is configured according to a type of Kalman filtering procedure. It is known from the prior art to perform an estimation for a movement value for an electric motor based on a drive model and based on the measured operating variables: motor current and motor voltage. Reference may be made to the relevant prior art. However, it is also to be noted that fundamentally other estimation methods may be applied for the solution in accordance with the proposal.

In detail, it can thus be that the estimated movement value $n_E$ is estimated in the estimation routine 9 according to an estimation method from a measured set of operating variables by taking into consideration the drive model.

Reference has already been made that the estimated movement value $n_E$ may be used in addition within the scope of an anti-trap protection function. It is then the case that in a trapping event test routine a check is performed on the estimated movement value $n_E$ as to whether a predefined trapping event has occurred. If a trapping event is detected, a trapping event reaction routine is then performed in which by way of example the movement of the flap 2 is stopped and/or reversed.

Finally, reference may still be made to the fact that the term "routine" in this case stands for a section of the method in accordance with the proposal, wherein the different routines are performed in part simultaneously. The method in accordance with the proposal can be performed using software that runs on the control arrangement 4. In this respect, the routines can be corresponding software routines.

According to various embodiments, the control arrangement 4 can be configured for performing the method in accordance with the disclosure. An essential aspect in this case is the fact that the control arrangement 4 is configured so as to implement the estimation routine 9 and the correction routine 11. Reference may be made to all relevant embodiments relating to the method in accordance with the proposal.

According to various embodiments, the drive arrangement 1 having the drive 5, which in the assembled state is coupled to the flap 2 in terms of providing a drive, and having an above mentioned control arrangement 4, is disclosed. In this case, it is naturally also possible to provide that the further drive 6 is coupled to the flap 2. It is also possible with respect to the further doctrine that reference is made to all statements relating to the method in accordance with the proposal.

According to a further doctrine that is likewise awarded independent status, finally a flap arrangement of a motor vehicle having a flap 2 and having a drive arrangement 1 that is allocated to the flap 2 and is in accordance with the proposal is disclosed. Reference may also be made in this respect to all relevant statements relating to the method in accordance with the proposal.

The invention claimed is:

1. A method for controlling a drive arrangement for a flap of a motor vehicle a control arrangement, wherein the drive arrangement comprises at least one electric drive that is coupled to the flap in terms of providing a drive,
wherein in a measuring routine a measured movement value for the drive is measured by a movement measuring system,
wherein in an estimation routine an estimated movement value for the drive is estimated based on a drive model that may be parameterized by a set of model parameters,
wherein in a movement routine the estimated movement value is continuously determined via the estimation routine and the flap is adjusted according to a set movement value that is present in the control arrangement in a motorized movement cycle based on the estimated movement value,
wherein in a correction routine for a movement cycle the estimated movement value is determined from the estimation routine and an estimation error is determined from the measured movement value and from the estimated movement value and according to a correction specification the set of model parameters is corrected based on the estimation error and supplied to the estimation routine and
wherein in the correction routine the correction of the set of model parameters is only performed for at least a part section of the motorized movement cycle.

2. The method as claimed in claim 1, wherein the movement value is a position value for the drive and/or for the flap, or the movement value is a speed value or an acceleration value for the drive and/or for the flap.

3. The method as claimed in claim 1, wherein the measured movement value as such is not taken into consideration in the movement routine during the adjustment of the flap.

4. The method as claimed in claim 1, wherein in the estimation routine the estimated movement value for the drive is continuously based on the last corrected drive model.

5. The method as claimed in claim 1, further comprising a trigger routine and in the trigger routine the procedure of correcting the set of model parameters via the correction routine is triggered according to a trigger criterion.

6. The method as claimed in claim 5, wherein a trigger criterion is the presence of a measured movement value having a predetermined reliability characteristic.

7. The method as claimed in claim 6, wherein the reliability characteristic is the measured movement value being below a limit variance.

8. The method as claimed in claim 1, wherein the movement cylinder starts with a start-up section and the particular part section of the motorized movement cycle that is allocated to the correction routine lies outside the start-up section, the estimated movement value is estimated in the start-up section of a movement cycle based on the drive model that is corrected in a preceding movement cycle, or the estimated movement value is estimated in the start-up section of a movement cycle based on a predefined drive model.

9. The method as claimed in claim 1, wherein the measurement of the measured movement value for the drive is based on the measurement of a drive current and/or on a drive voltage by the movement measuring system.

10. The method as claimed in claim 1, wherein the drive comprises an electric drive motor by which the respective movement cycle of the flap is generated.

11. The method as claimed in claim 10, wherein the electric drive motor comprises an electric DC motor.

12. The method as claimed in claim 1, wherein the drive current and/or the drive voltage having the drive movement of the drive comprises cyclic signal pulses in the drive current and/or in the drive voltage, and the signal pulse is measured by the movement measuring system and is determined from the measured signal pulses of the measured movement value.

13. The method as claimed in claim 1, wherein the drive model represents a correlation between a set of operating variables of the drive and the estimated movement value and the estimated movement value is determined based on the set of operating variables and the drive model.

14. The method as claimed in claim 13, wherein the drive comprises an electric drive motor, and the drive model provides a correlation between the set of operating variables, which are allocated to the drive motor, and the estimated movement value.

15. The method as claimed in claim 14, wherein the set of operating variables includes as respective operating variables the electrical motor current and/or the electrical motor voltage, or wherein the set of model parameters includes as respective model parameters an electrical winding inductivity of a drive winding in the drive model and/or an electrical winding resistance of a drive winding in the drive model.

16. The method as claimed in claim 13, wherein the estimated movement value is estimated according to an estimation method from a measured set of operating variables by taking into consideration the drive model.

17. The method as claimed in claim 16, wherein the estimation methods are configured according to a type of state observer in particular according to a type of Kalman filtering procedure.

18. A control arrangement for performing a method as claimed in claim 1.

19. A drive arrangement for a flap of a motor vehicle having at least one drive that in the assembled state is coupled to the flap in terms of providing a drive, and having a control arrangement as claimed in claim 18.

20. A flap arrangement of a motor vehicle having a flap and a drive arrangement that is allocated to the flap and is in accordance with claim 19.

* * * * *